United States Patent
Xu et al.

(10) Patent No.: US 12,451,411 B2
(45) Date of Patent: Oct. 21, 2025

(54) STRUCTURE WITH AIR GAPS EXTENDING FROM DIELECTRIC LINER AROUND THROUGH SEMICONDCUTOR VIA

(71) Applicant: GlobalFoundries U.S. Inc., Malta, NY (US)

(72) Inventors: Dewei Xu, Clifton Park, NY (US); Zhuojie Wu, Port Chester, NY (US); Daniel Smith, Ballston Spa, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 422 days.

(21) Appl. No.: 18/154,481

(22) Filed: Jan. 13, 2023

(65) Prior Publication Data
US 2024/0243037 A1 Jul. 18, 2024

(51) Int. Cl.
H01L 23/48 (2006.01)
H01L 21/768 (2006.01)
H01L 23/528 (2006.01)

(52) U.S. Cl.
CPC ........ *H01L 23/481* (2013.01); *H01L 21/7682* (2013.01); *H01L 21/76831* (2013.01); *H01L 21/76877* (2013.01); *H01L 21/76898* (2013.01); *H01L 23/528* (2013.01)

(58) Field of Classification Search
CPC ............... H01L 21/764; H01L 21/7682; H01L 21/76831; H01L 21/76841; H01L 21/76877; H01L 21/76898; H01L 23/481; H01L 23/49827; H01L 23/528; H01L 23/53204; H01L 2225/06548
See application file for complete search history.

(56) References Cited

U.S. PATENT DOCUMENTS

| | | | |
|---|---|---|---|
| 6,214,719 B1 | 4/2001 | Nag | |
| 7,969,013 B2 | 6/2011 | Chen et al. | |
| 8,647,920 B2 | 2/2014 | Tezcan et al. | |
| 8,742,590 B2 | 6/2014 | Beyne | |
| 2012/0068348 A1 | 3/2012 | Kirby et al. | |
| 2013/0161825 A1 | 6/2013 | Hsu et al. | |
| 2020/0161218 A1 | 5/2020 | Shank et al. | |
| 2022/0310486 A1 | 9/2022 | Pandey et al. | |

FOREIGN PATENT DOCUMENTS

CN 104078414 B 2/2017

OTHER PUBLICATIONS

Civale et al., "A Novel Concept for Ultra-Low Capacitance Via-Last TSV," 2010 IEEE International 3D Systems Integration Conference (3DIC), IMEC, 4 pages.
Huang et al., "Implementation of Air-Gap Through-Silicon-Vias (TSVs) Using Sacrificial Technology," IEEE Transactions on Components, Packaging and Manufacturing Technology, 3:1430-38, Aug. 2013, 10 pages.
European Search Report dated Jan. 16, 2024 for EP Application 23195335.7; pp. 11.
U.S. Appl. No. 18/340,174, Application as Filed on Jun. 22, 2023, 32 pages.

*Primary Examiner* — Cheung Lee
(74) *Attorney, Agent, or Firm* — Anthony Canale; Hoffman Warnick LLC

(57) ABSTRACT

A structure includes a through semiconductor via (TSV) in a semiconductor substrate, and a dielectric liner surrounding the TSV and between the TSV and the semiconductor substrate. A plurality of discontinuous air gaps is in the semiconductor substrate extending away from the dielectric liner, e.g., radially. The discontinuous air gaps reduce the parasitic coupling capacitance and relieve stress in the semiconductor substrate.

20 Claims, 7 Drawing Sheets

STRUCTURE WITH AIR GAPS EXTENDING FROM DIELECTRIC LINER AROUND THROUGH SEMICONDCUTOR VIA

BACKGROUND

The present disclosure relates to semiconductor structures and, more particularly, to a structure with air gaps in a semiconductor substrate extending away from a dielectric liner around a through semiconductor via.

Through semiconductor vias (TSVs) are vertical electrical contacts that extend through a semiconductor substrate to allow electrical between integrated circuit (IC) structures on one side of the semiconductor substrate and IC structures on the other side of the semiconductor substrate. TSVs include one or more conductors. A dielectric liner surrounds the TSV. A parasitic coupling capacitance is formed by the TSV conductors and the semiconductor substrate with the dielectric liner therebetween. The parasitic coupling capacitance can increase delay and power consumption of the IC structures. It is a challenge to limit the parasitic coupling capacitance in this setting.

SUMMARY

All aspects, examples and features mentioned below can be combined in any technically possible way.

An aspect of the disclosure provides a structure, comprising: a through semiconductor via (TSV) in a semiconductor substrate; a dielectric liner surrounding the TSV and between the TSV and the semiconductor substrate; and a plurality of discontinuous air gaps in the semiconductor substrate extending away from the dielectric liner.

An aspect of the disclosure provides a structure, comprising: a through semiconductor via (TSV) in a semiconductor substrate; a dielectric liner surrounding the TSV and between the TSV and the semiconductor substrate; and a plurality of elongated air gaps in the semiconductor substrate adjacent to the dielectric liner, each air gap having a first end contacting the dielectric liner and a second end distanced from the dielectric liner.

An aspect of the disclosure provides a method comprising: forming a through semiconductor via (TSV) in a frontside of a semiconductor substrate and a dielectric liner surrounding the TSV and between the TSV and the semiconductor substrate; forming a plurality of elongated air gaps in the semiconductor substrate adjacent to the dielectric liner, each air gap having a first end contacting the dielectric liner and a second end distanced from the dielectric liner; and planarizing a backside of the semiconductor substrate to complete the TSV Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
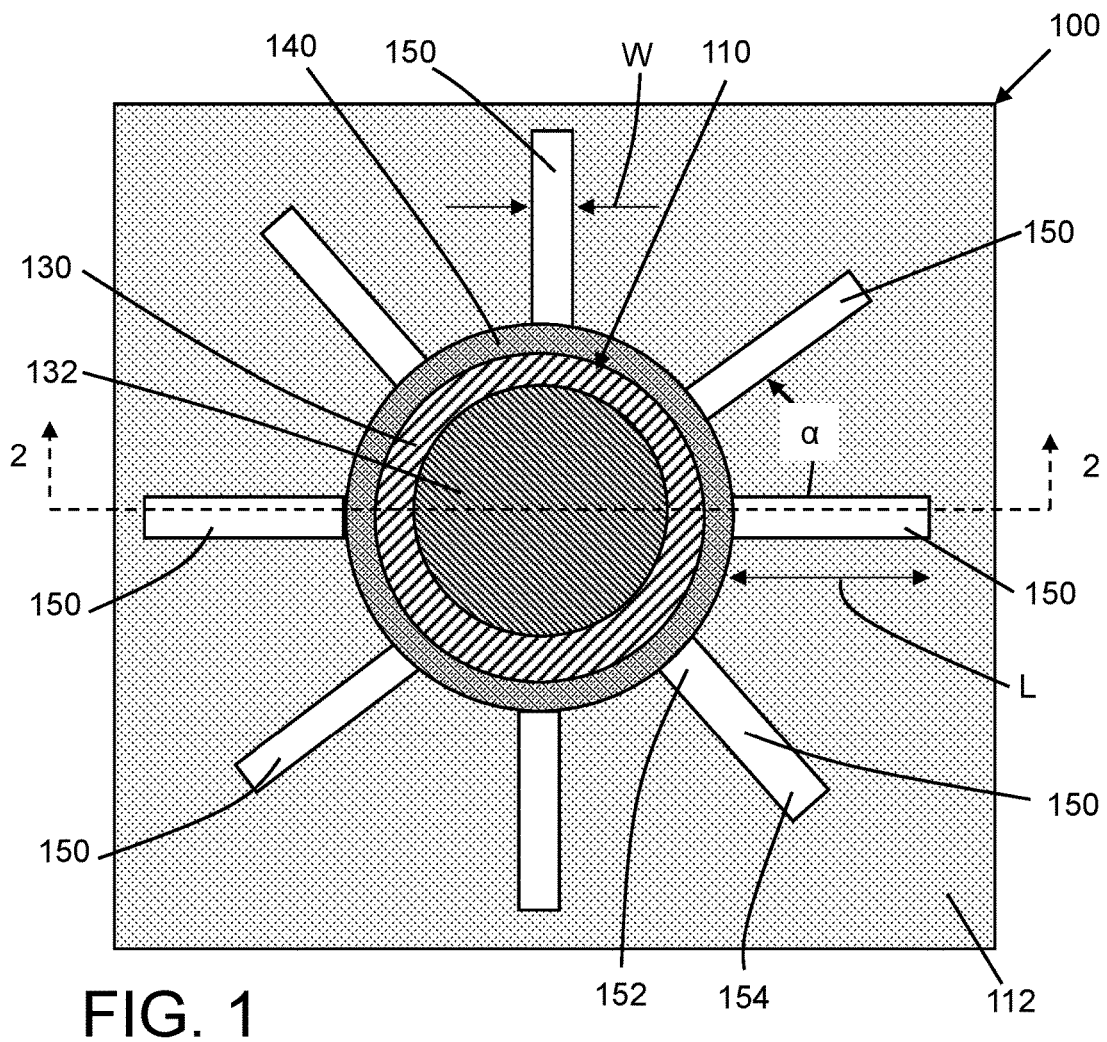
FIG. 1 shows a top-down view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure including a structure including a through semiconductor via (TSV) in a semiconductor substrate, and a dielectric liner surrounding the TSV and between the TSV and the semiconductor substrate. A plurality of discontinuous air gaps is in the semiconductor substrate extending away from the dielectric liner, e.g., radially. The discontinuous air gaps reduce the parasitic coupling capacitance of the TSV and relieve stress in the semiconductor substrate.

Figure 2:
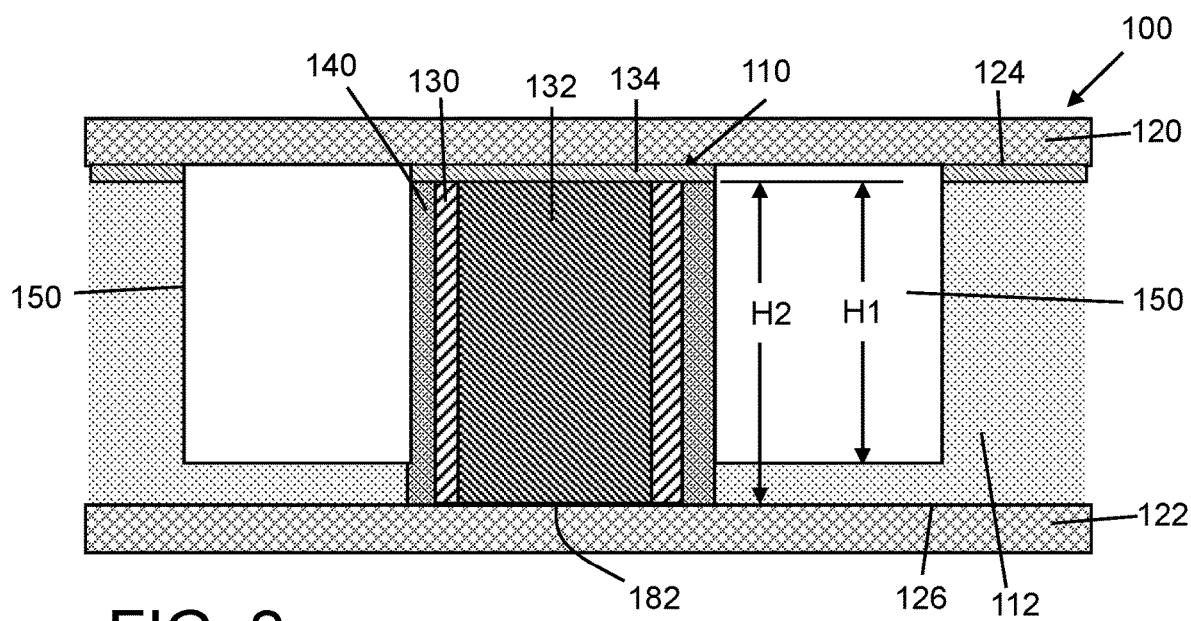
FIG. 2 shows a cross-sectional view of the structure along view line 2-2 in FIG. 1.

FIG. 1 shows a top-down view and FIG. 2 shows a schematic cross-sectional view along view line 2-2 in FIG. 1 of a structure 100 according to embodiments of the disclosure. Structure 100 includes a through semiconductor via (TSV) 110 in a semiconductor substrate 112. Semiconductor substrate 112 includes a layer of material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants in semiconductor substrate 112 may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region of substrate 112. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

As shown in FIG. 2, integrated circuit (IC) structures 120, 122 may be positioned on a frontside 124 and a backside 126 of semiconductor substrate 112, creating a heterogenous integrated circuit structure. IC structures 120, 122 may include any now known or later developed integrated circuitry including active, passive, photonics or other circuitry. In addition, IC structures 120, 122 may include any now known or later developed middle-of-line (MOL) interconnect layers and/or back-end-of-line (BEOL) interconnect layers for interconnecting components within each IC structure 120, 122.

TSV 110 may include any now known or later developed contact or via structure electrically coupling portions of IC structures 120, 122 through semiconductor substrate 112, i.e., from frontside 124 to backside 126. TSV 110 may include one or more conductors. The conductors may include, for example, a refractory metal liner 130 and a contact metal 132. Refractory metal liner 130 may include, for example, ruthenium (Ru), tantalum (Ta), titanium (Ti), tungsten (W), iridium (Ir), rhodium (Rh), platinum (Pt), nitrides of the preceding list, and mixtures thereof. Contact metal 132 may include any now known or later developed contact metal such as but not limited to copper (Cu) or tungsten (W). TSV 110 may include a cap layer 134 (FIG. 2, removed from top-down figures) thereon.

Structure 100 also includes a dielectric liner 140 surrounding TSV 110 and between the TSV 110 and semiconductor substrate 112. Dielectric liner 140 electrically insulates TSV 110 from semiconductor substrate 112. Dielectric liner 140 may include any insulative material typically used to electrically isolate a TSV from a semiconductor substrate including but not limited to an oxide such as silicon dioxide. Refractory metal liner 130 prevents electromigration of contact metal 132 into dielectric liner 140.

TSV 110 within semiconductor substrate 112 with dielectric liner 140 therebetween creates a parasitic coupling capacitance. More particularly, TSV 110 represents one capacitor electrode and semiconductor substrate 112 represents another capacitor electrode with dielectric liner 140 providing a capacitor dielectric. As noted, the parasitic coupling capacitance can increase delay and power consumption of IC structure 120, 122. In order to reduce an area of semiconductor substrate 112 that acts as an electrode and reduce the parasitic coupling capacitance, structure 100 according to embodiments of the disclosure includes a plurality of discontinuous air gaps 150 in semiconductor substrate 112 extending away from dielectric liner 140. The plurality of discontinuous air gaps 150 (hereinafter "air gaps 150" or "air gap 150" as appropriate) are discontinuous because a portion of semiconductor substrate 112 separates each air gap 150 extending away from a given dielectric liner 140 of a given TSV 110. Air gaps 150 are elongated in semiconductor substrate 112 adjacent to dielectric liner 140 so they extend away from it. More particularly, each air gap 150 has a first end 152 contacting dielectric liner 140 and a second end 154 distanced from dielectric liner 140. Air gaps 150 contact dielectric liner 140 but are not in dielectric liner 140—air gaps 150 are not surrounded by dielectric liner 140. Air gaps 150 also do not intersect or penetrate dielectric liner 140. Air gaps 150 also do not collectively encircle dielectric liner 140, i.e., some portion of semiconductor substrate 112 contacts dielectric liner 140 between adjacent air gaps 150.

In the FIG. 1 embodiment, air gaps 150 in semiconductor substrate 112 radiate outwardly from dielectric liner 140. That is, they extend radially outward from dielectric liner 140, i.e., generally, with an axis A of TSV 110 as a center given fabrication tolerances. However, as will be described herein, this is not necessary in all cases. It will also be recognized that while TSV 110 and dielectric liner 140 are illustrated as generally circular, some variation in shapes may be possible. For example, TSV 110 and dielectric liner 140 may be laterally ovular or oblong, or may have some straight sides.

In certain embodiments, as shown in FIG. 1, air gaps 150 may be circumferentially equidistantly spaced about TSV 110, i.e., with an equal angle α between adjacent air gaps 150. In the example shown in FIG. 1, eight air gaps 150 are provided, and are circumferentially equidistantly spaced with adjacent air gaps separated by an angle α of approximately 45°. In another example shown in the top-down view of FIG. 3, four air gaps 150 are provided, and are circumferentially equidistantly spaced with adjacent air gaps 150 separated by an angle β of approximately 90°. "Approximate," as used throughout the specification and claims, may be applied to modify any quantitative representation (value or range) that could permissibly vary without resulting in a change in the basic function to which it is related and is within any appropriate semiconductor fabrication tolerances. Circumferentially equidistant spacing between air gaps 150 is not necessary in all cases. In other embodiments, as shown for example in top-down view of FIG. 4, air gaps 150 may not be circumferentially equidistantly spaced about TSV 110, i.e., a variety of different angles may be between adjacent air gaps 150.

The number of air gaps 150 may be user selected. For example, in FIGS. 1 and 4, eight air gaps 150 are used, and in FIG. 3, four air gaps are used. Any number of air gaps 150 may be used to remove any desired amount of semiconductor substrate 112 to reduce the parasitic coupling capacitance.

Figure 3:
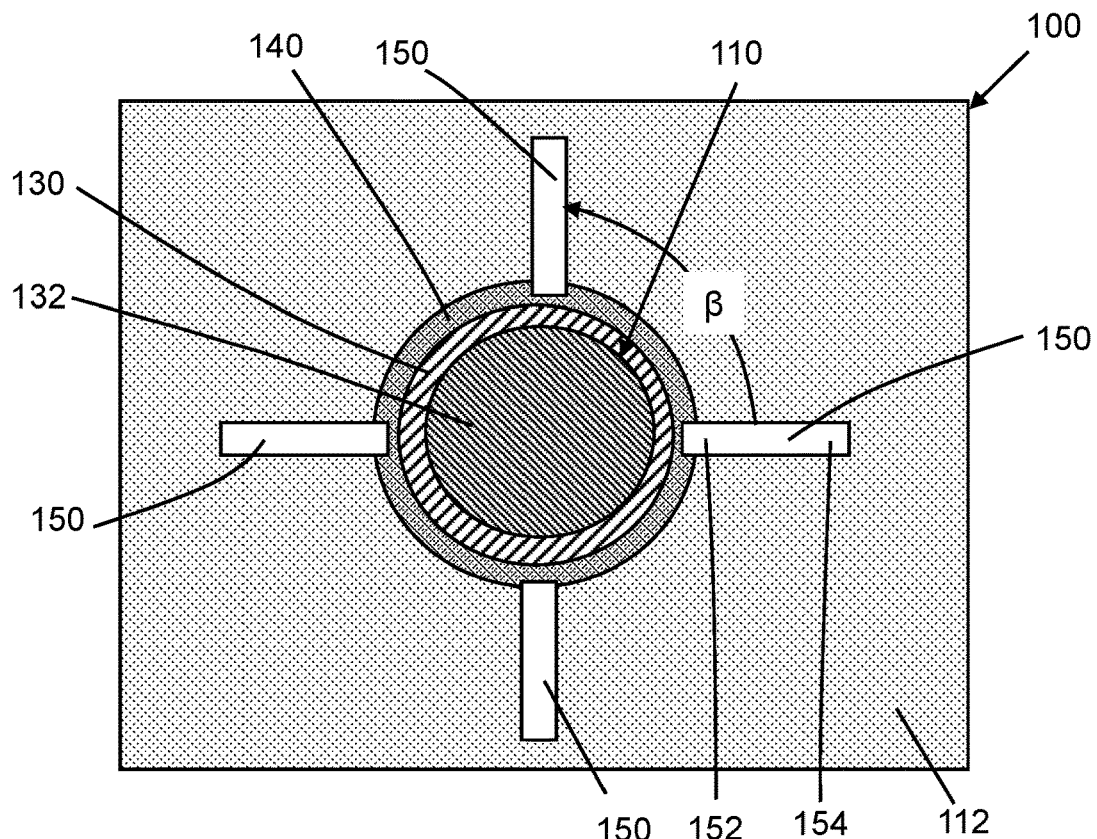
FIG. 3 shows a top-down view of a structure according to other embodiments of the disclosure.
Figure 4:
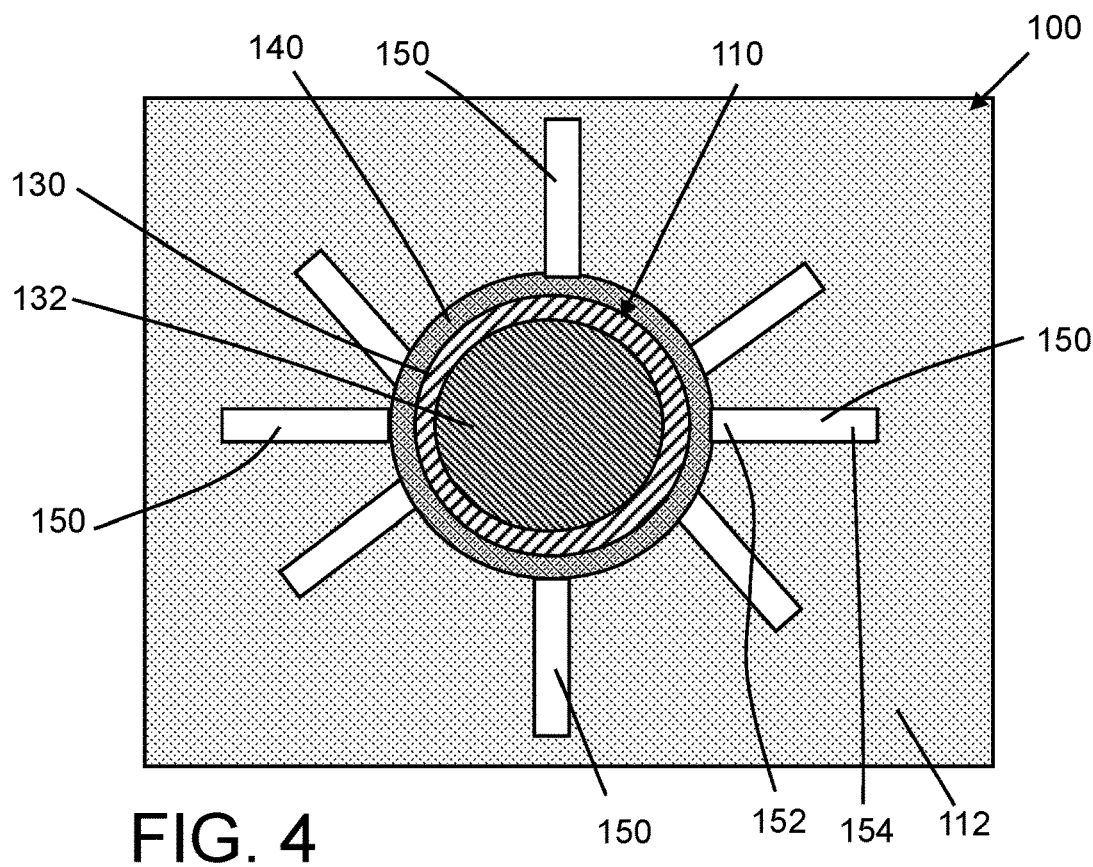
FIG. 4 shows a top-down view of a structure according to additional embodiments of the disclosure.

The shape and dimensions of air gaps 150 may be limited by pinch-off capabilities for the particular dielectric layer 180 (FIGS. 12-13) used to seal air gaps 150. Dielectric layer 180 may be part of any adjacent dielectric layer to semiconductor substrate 112, e.g., a first metal layer dielectric of IC structures 120, 122 (FIG. 1). In FIGS. 1, 3 and 4, each air gap 150 has a rectangular shape. In certain embodiments, as shown in FIG. 1, each air gap 150 may have a width W in a range of approximately 200 to 800 nanometers (nm), and a length L in a range of approximately 1000 to 4000 nm. As will be described, other shapes and dimensions are possible.

Figure 5:
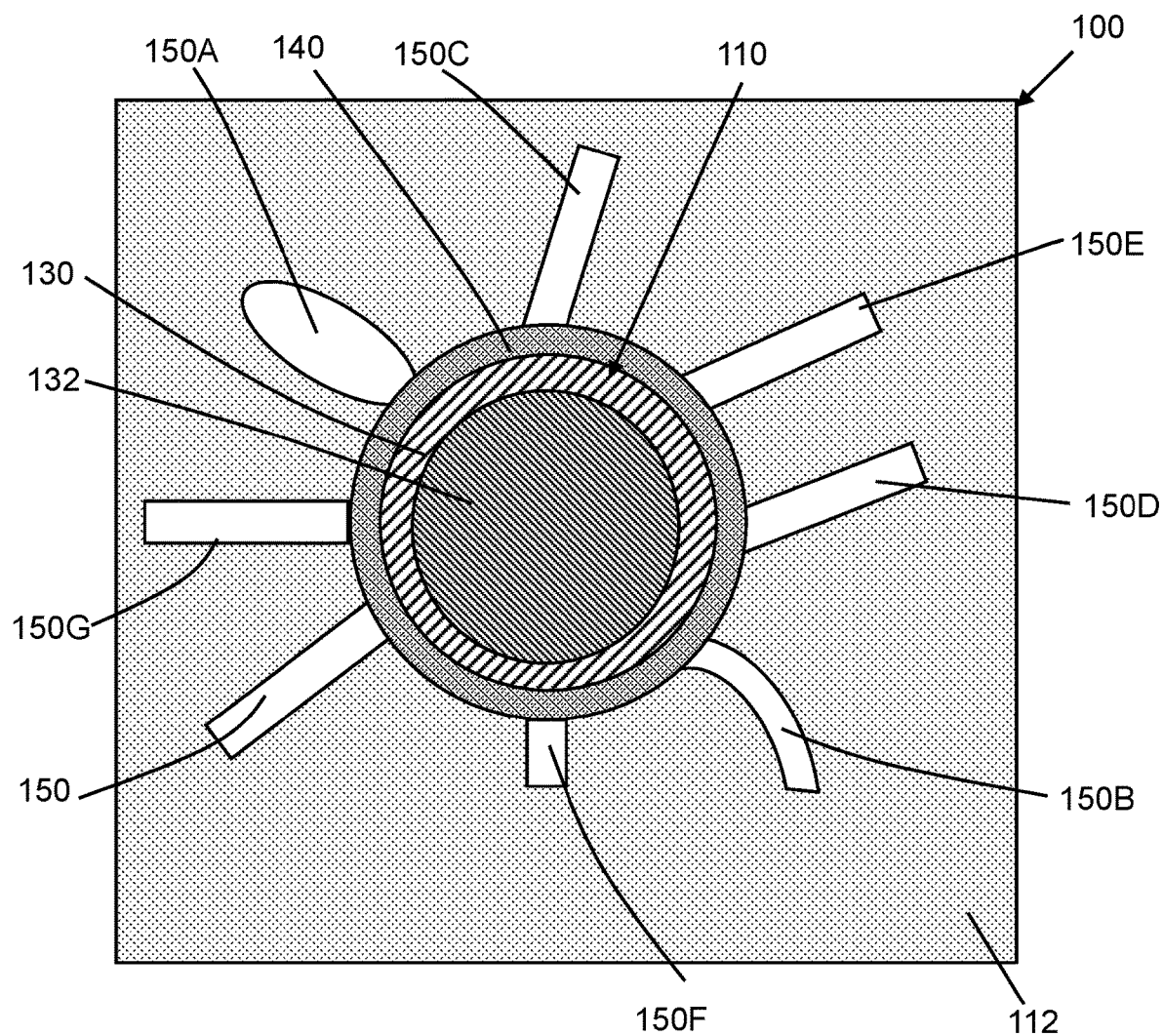
FIG. 5 shows a top-down view of a structure according to other embodiments of the disclosure.

While air gaps 150 are all shown with the same length, their lengths may be different around a given TSV 110, e.g., see air gaps 150F, 150G in FIG. 5.

Referring again to FIG. 2, air gaps 150 may have a height H1 that is selected to remove as much of semiconductor substrate 112 as possible, e.g., to reduce parasitic coupling capacitance, without causing structural issues. In certain embodiments, each air gap 150 may have a height H1 that is up to approximately 90% of a height H2 of TSV 110. In one non-limiting example, air gaps 150 may have height H2 in a range of 10000 nanometers (nm) to 45000 nm. Other heights are also possible depending on height H2 of TSV 110 and/or a height of semiconductor substrate 112.

FIG. 5 shows a non-comprehensive assortment of alternative embodiments of air gaps 150. As shown in FIG. 5, air gaps 150 can have shapes other than rectangular such as but not limited to laterally ovular or oblong air gaps 150A, or a laterally curved air gaps 150B. Air gaps 150 can extend away from dielectric liner 140 in a non-radial fashion, see e.g., non-radial air gaps 150C, 150D or parallel air gaps 150D, 150E. As noted, air gaps 150 can also have different lengths around a given TSV 110, which can be observed by comparing, for example, air gaps 150F, 150G. It is emphasized that the assortment of air gaps 150 shown in FIG. 5 would probably not be used together exactly as shown in the figure. Rather, the individual air gaps 150 or certain collections thereof would be repeated to create the desired air gap arrangement.

Figure 6:
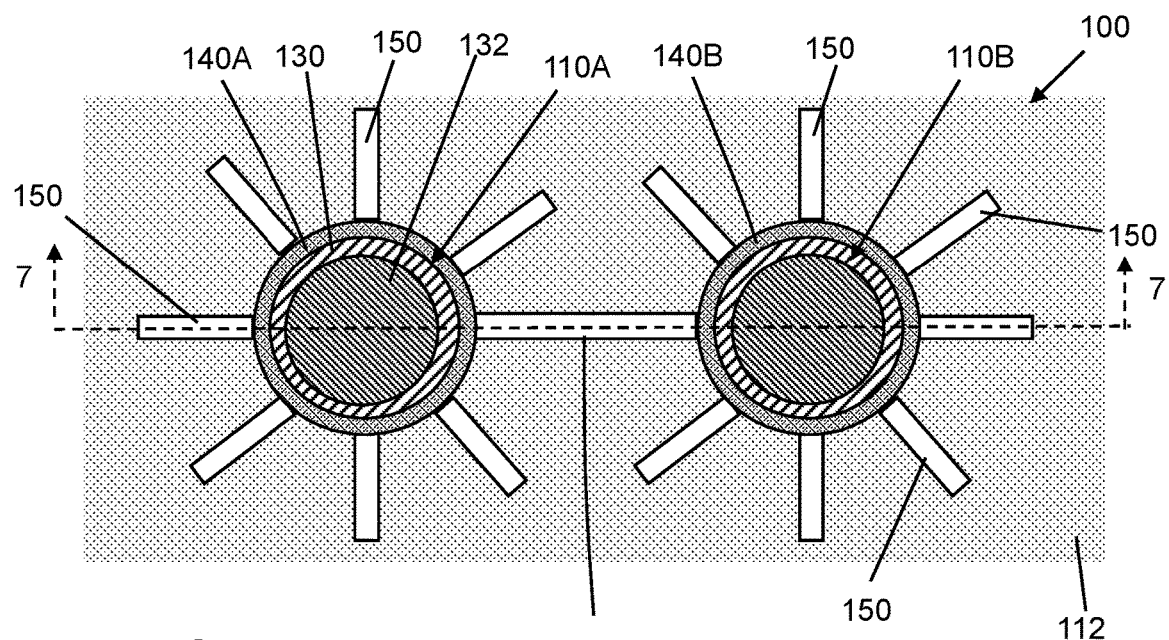
FIG. 6 shows a top-down view of a structure according to embodiments of the disclosure.
Figure 7:
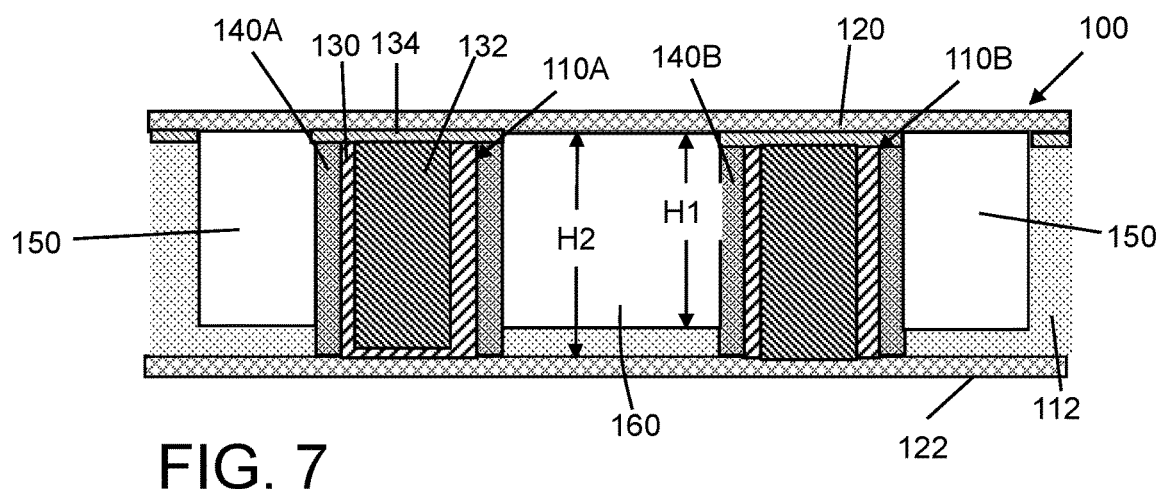
FIG. 7 shows a cross-sectional view of the structure along view line 7-7 in FIG. 6.

FIG. 6 shows a top-down view and FIG. 7 shows a schematic cross-sectional view along view line 7-7 in FIG. 6 of structure 100 according to other embodiments of the disclosure. FIGS. 6 and 7 show a pair of adjacent TSVs 110A, 110B in semiconductor substrate 112. Each of the pair of adjacent TSVs 110A, 110B include a respective dielectric liner 140A, 140B. In certain embodiments, as shown in FIGS. 6 and 7, pair of TSVs 110A, 110B include a shared air gap 160 extending between the pair of adjacent TSVs 110A, 110B and their respective dielectric liners 140A, 140B. In this case, either the air gaps between TSVs 110A, 110B merge or a single air gap is formed therebetween. A shared air gap 160 may be desired where TSVs 110A, 110B are sufficiently close that two single air gaps may be challenging to fabricate. Shared air gap 160 can otherwise have any of the shapes and dimensions (length perhaps doubled) described herein.

Figure 8:
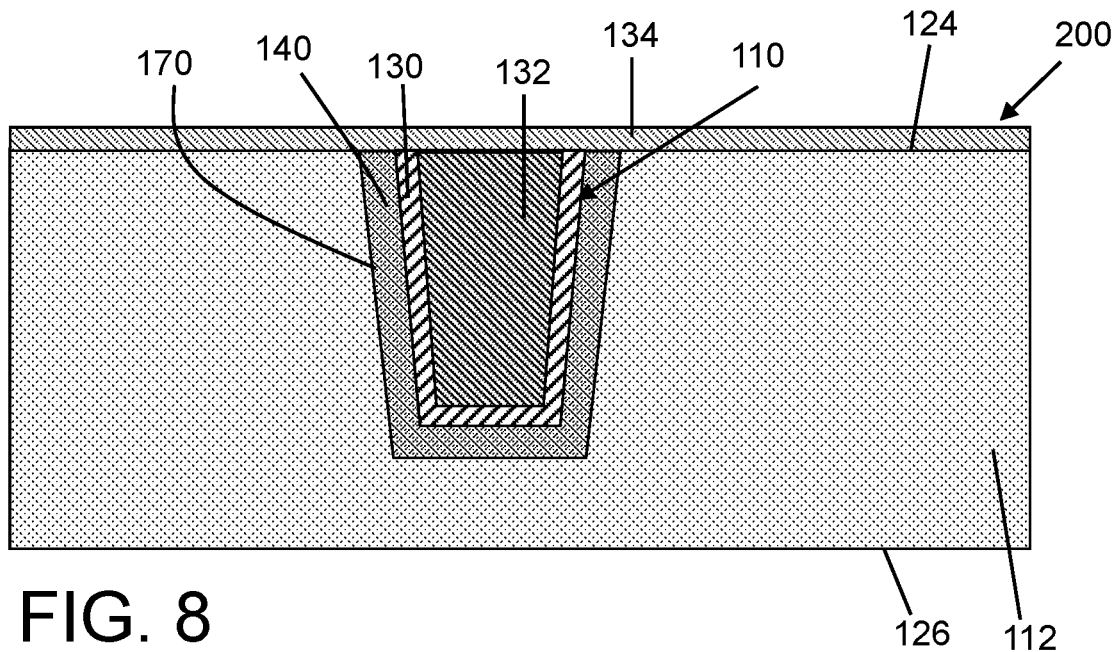
FIG. 8 shows a cross-sectional view of part of a method of forming the structure according to embodiments of the disclosure.

FIGS. 8-9, 11-13 show cross-sectional views of parts of a method of forming structure 100 according to embodiments of the disclosure. FIG. 10 shows a top-down view of a mask 174 for forming air gap openings for the FIG. 1 embodiments. It will be recognized that air gaps 150 can be formed in a number of ways, and the method described herein is only illustrative. FIG. 8 shows an initial structure 200 after (partially) forming TSV 110 in frontside of semiconductor substrate 112 and dielectric liner 140 surrounding TSV 110 and between TSV 110 and semiconductor substrate 112. Semiconductor substrate 112 can be provided in any now known or later developed fashion and may include any variety of dopants required for the active circuitry of IC structures 120, 122 formed on/in frontside 124 and on/in backside 126 thereof. TSV 110 and dielectric liner 140 may be formed, for example, by forming a TSV opening 170 in semiconductor substrate 112 using any now known or later developed semiconductor fabrication techniques, e.g., patterning a mask (not shown) and etching TSV opening 170 into semiconductor substrate 112. Dielectric liner 140 may then be deposited into TSV opening 170, e.g., using chemical vapor deposition. TSV 110 conductors such as refractory metal liner 130 and contact metal 132 can then be deposited, e.g., using CVD or other appropriate deposition techniques. Subsequently, a planarization, e.g., chemical mechanical polishing, is performed to remove excess materials. Thereafter, cap layer 134 of, e.g., silicon nitride, may be formed thereover by any appropriate deposition technique, e.g., CVD. At this stage, TSV 110 does not extend through backside 126 of semiconductor substrate 112.

Figure 9:
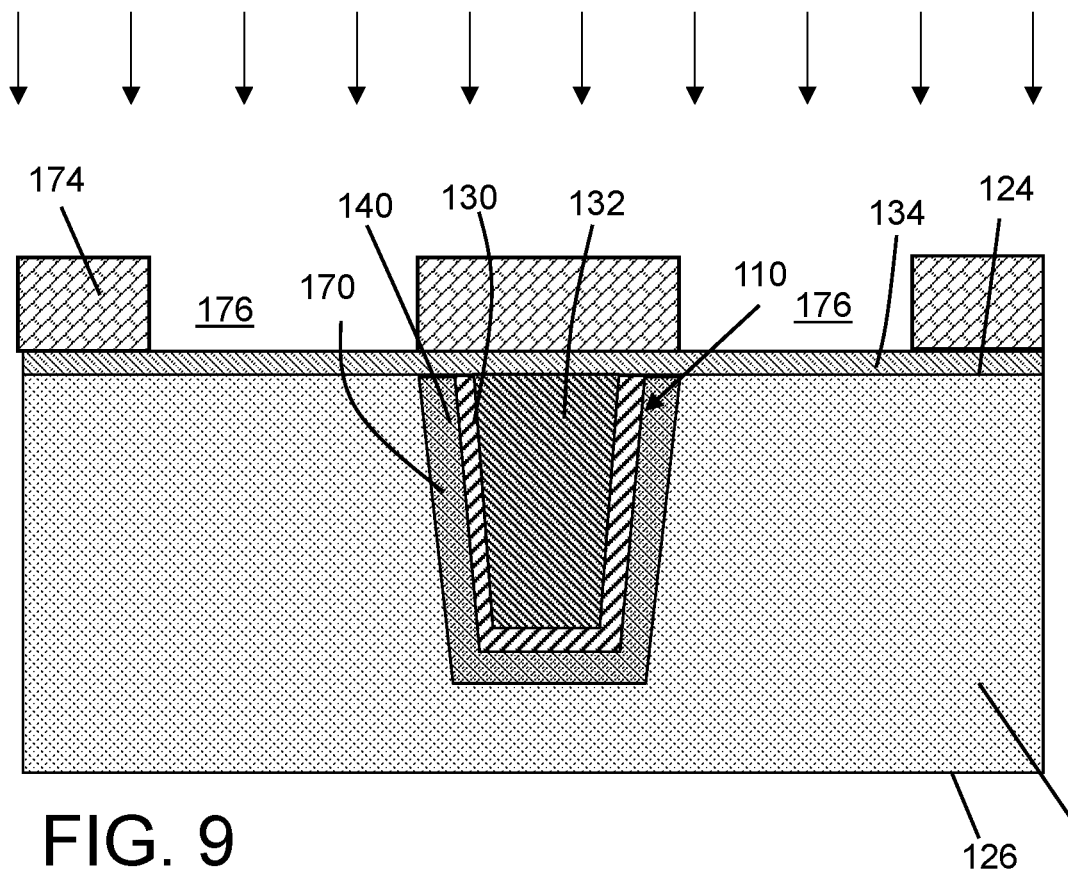
FIG. 9 shows a cross-sectional view of part of a method of forming the structure according to embodiments of the disclosure.
Figure 10:
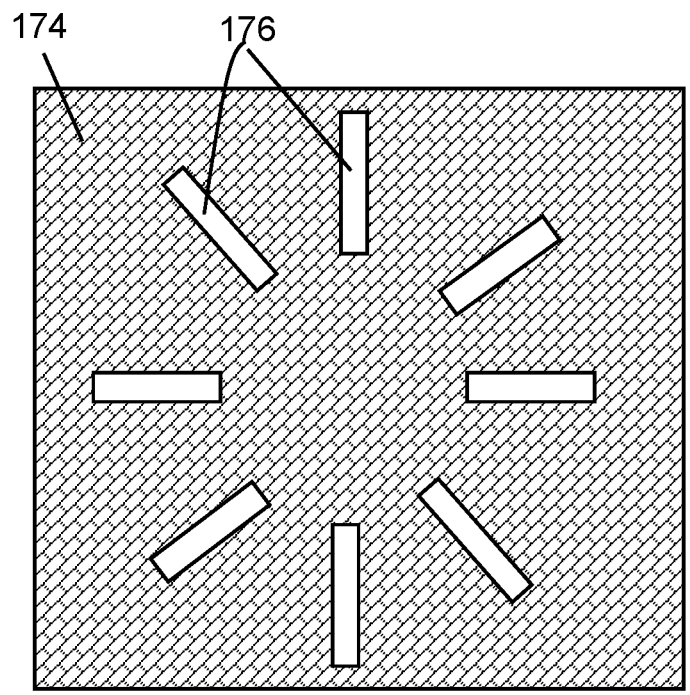
FIG. 10 shows a top-down view of an illustrative mask for forming the structure in FIGS. 1 and 2.
Figure 11:
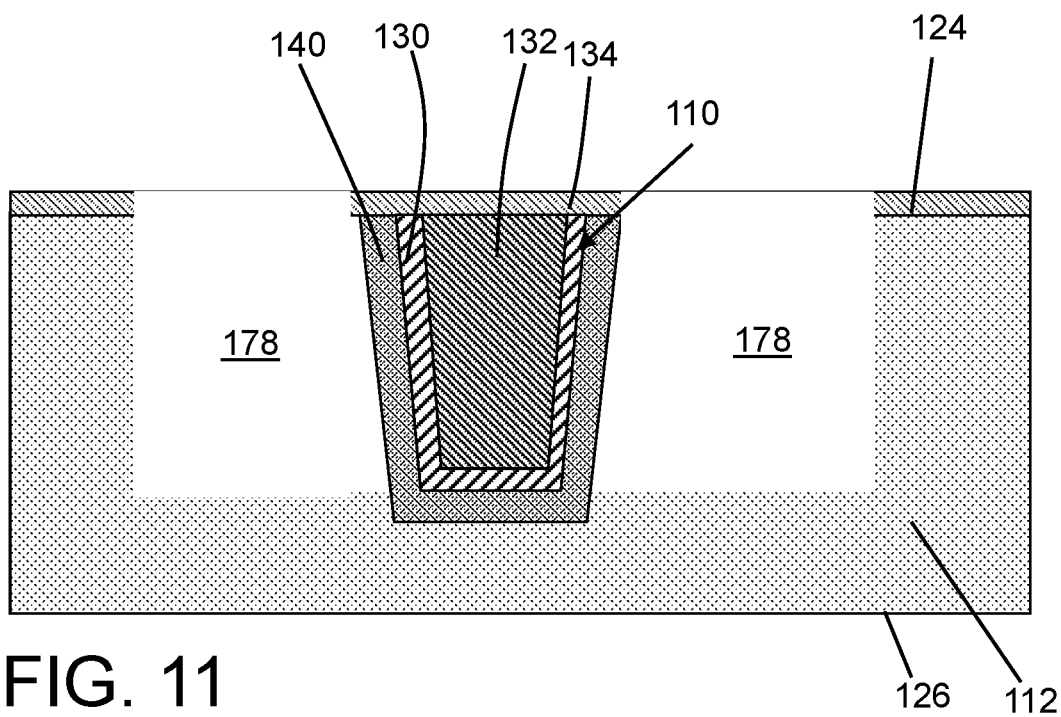
FIG. 11 shows a cross-sectional view of part of a method of forming the structure according to embodiments of the disclosure.

FIGS. 9-13 show forming a plurality of elongated air gaps 150 (FIGS. 12-13) in semiconductor substrate 112 adjacent to dielectric liner 140. FIG. 9 shows patterning a mask 174 to include openings 176 for forming air gaps 150 (FIG. 1). As noted, FIG. 10 shows a top-down view of mask 174 for forming air gap openings 178 (FIG. 11) for the FIG. 1 embodiment. Mask 174 may include any appropriate masking material, e.g., a photoresist or hard mask material. As shown in FIG. 10, openings 176 in mask 174 are configured to form air gap openings 178 (FIG. 11) in the desired pattern about dielectric liner 140 (FIG. 11). It will be recognized by those with skill in the art that openings 176 in mask 174 can be arranged to form air gaps 150 as illustrated in any embodiment herein, including shared air gaps 160 (FIGS. 6-7) between a pair of adjacent TSVs 110A, 110B. FIG. 11 shows the structure after etching air gap openings 178 into semiconductor substrate 112. The etching chemistry and duration can be arranged such that air gap openings 178 achieve, as shown in FIG. 2, the desired height H1 for the air gaps relative to TSV 110 and/or semiconductor substrate 112, e.g., approximately 90% of height H2 of TSV 110. In addition, the etching chemistry and openings 176 in mask 174 can be configured to generate the desired shape and dimension(s), as previously described, for air gaps 150.

Figure 12:
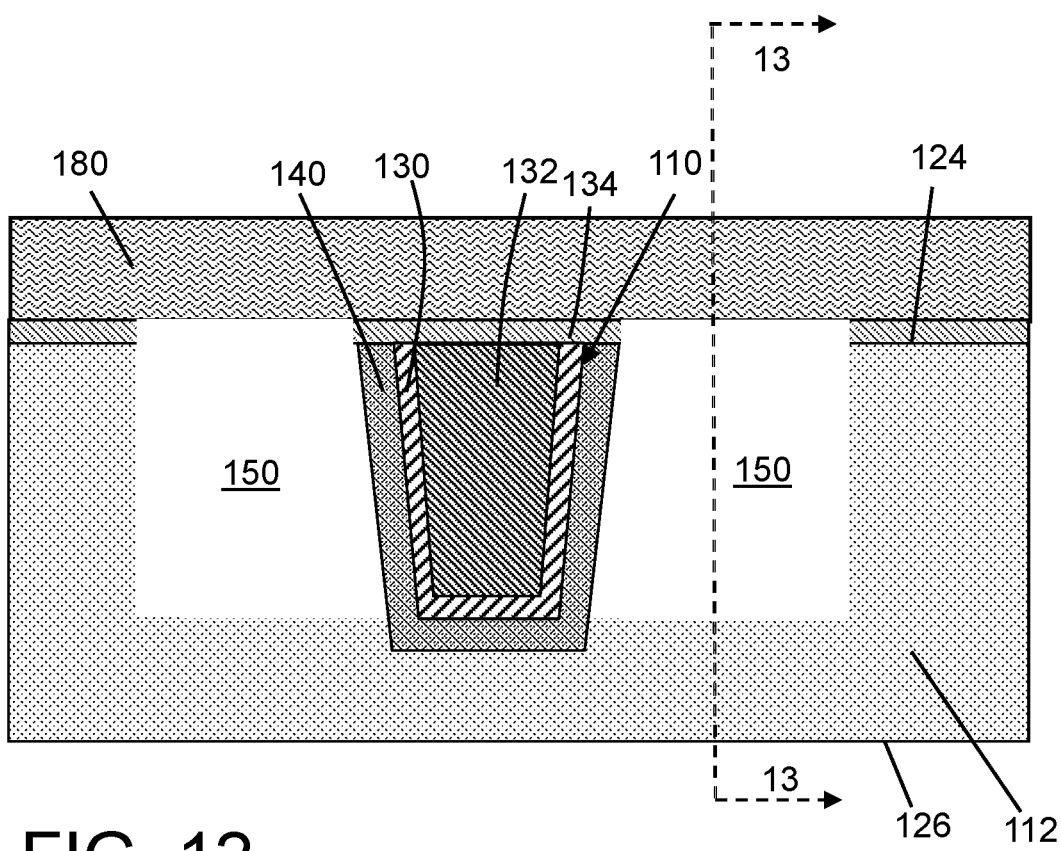
FIG. 12 shows a cross-sectional view of part of a method of forming the structure according to embodiments of the disclosure.
Figure 13:
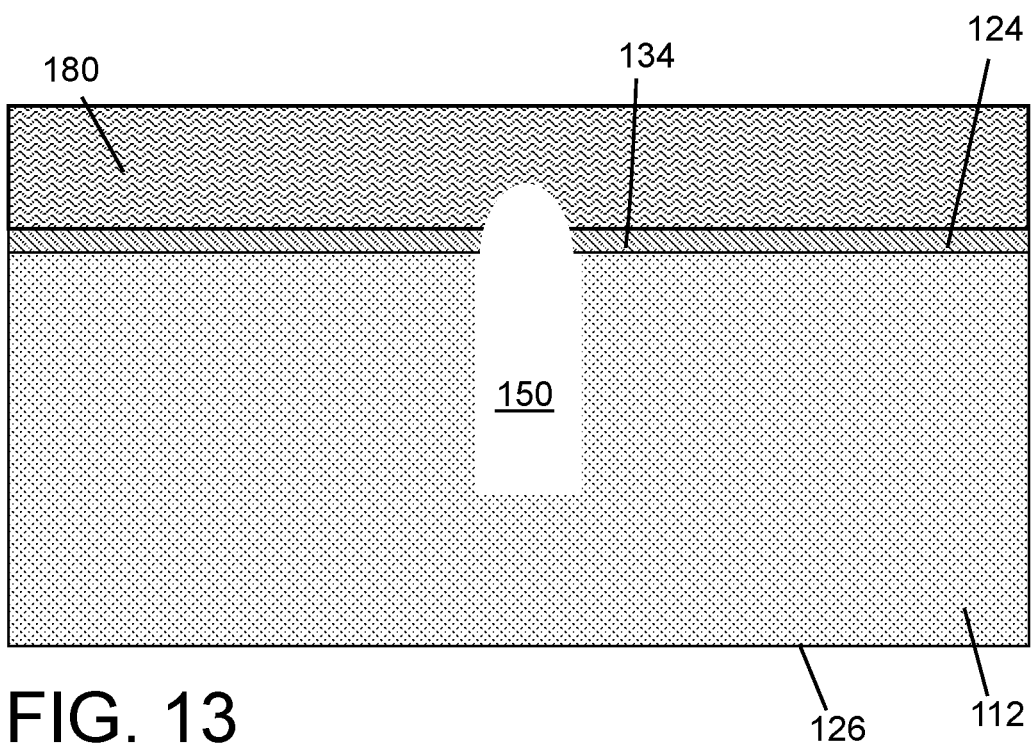
FIG. 13 shows a cross-sectional view of the structure along view line 13-13 in FIG. 12.

FIG. 12 shows a cross-sectional view and FIG. 13 shows a cross-sectional view along view line 13-13 in FIG. 12 of the structure after depositing a dielectric layer 180 to seal air gap openings 178 and form air gaps 150 (and/or 160 FIGS. 6-7). Air gaps 150 can have any individual shape and/or dimensions, and collectively can have any arrangement, as described herein. For example, individually, each air gap 150 has first end 152 contacting dielectric liner 140 and second end 154 distanced from dielectric liner 140. As noted, air gaps 150 in semiconductor substrate 112 may radiate outwardly from dielectric liner 140. Other arrangements are shown in the various drawings previously described.

Dielectric layer 180 may include any now known or later developed dielectric material capable of pinching off or sealing air gaps 150, as shown in FIG. 13. Dielectric layer 180 may include, for example, an interlayer dielectric such as but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Dielectric layer 180 may be the dielectric for, for example, a first metal or first via layer of IC structure 120 to be subsequently formed on frontside 124 of semiconductor substrate 112.

FIG. 2 shows structure 100 after planarizing backside 126 of semiconductor substrate 112 to complete the TSV 110, e.g., by CMP. In a known fashion, the planarization exposes a bottom end 182 of TSV 110 for electrical interconnection to IC structure 122 on backside 126 of semiconductor substrate 112. FIG. 2 also schematically shows the formation of IC structures 120, 122 in a known fashion.

Embodiments of the disclosure provide various technical and commercial advantages, examples of which are discussed herein. The structure described herein provides lowered parasitic capacitance coupling between TSVs and a semiconductor substrate in which the TSVs are positioned. The air gaps reduce an area of the semiconductor substrate acting as a capacitor electrode. In certain embodiments, a four (4) air gap embodiment exhibits approximately 20.4% reduction in parasitic capacitance coupling compared to a no air gap embodiment, and an eight (8) air gap embodiment exhibits approximately a 40.8% reduction in parasitic capacitance coupling compared to a no air gap embodiment. The structure also respects keep out zones (KOZ), e.g., 5000 nm space, typically experienced as part of design rules. The structure also advantageous provides stress relaxation in the semiconductor substrate.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related and within any appropriate semiconductor fabrication tolerances. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The corresponding structures, materials, acts, and equivalents of all means or step plus function elements in the claims below are intended to include any structure, material, or act for performing the function in combination with other claimed elements as specifically claimed.

The description of the present disclosure has been presented for purposes of illustration and description but is not intended to be exhaustive or limited to the disclosure in the form disclosed.

Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a through semiconductor via (TSV) in a semiconductor substrate;
   a dielectric liner surrounding the TSV and between the TSV and the semiconductor substrate; and
   a plurality of discontinuous air gaps in the semiconductor substrate extending away from the dielectric liner and including at least one sidewall immediately contacting the semiconductor substrate.

2. The structure of claim 1, wherein the plurality of discontinuous air gaps in the semiconductor substrate radiate outwardly from the dielectric liner.

3. The structure of claim 1, wherein each of the plurality of discontinuous air gaps have a rectangular shape.

4. The structure of claim 3, wherein each of the plurality of discontinuous air gaps have a width in a range of approximately 200 to 800 nanometers (nm), and a length in a range of approximately 1000 to 4000 nm.

5. The structure of claim 1, wherein each of the plurality of discontinuous air gaps have a height that is up to approximately 90% of a height of the TSV.

6. The structure of claim 1, wherein each of the plurality of discontinuous air gaps contact an outermost sidewall of the dielectric liner and are entirely outside the dielectric liner.

7. The structure of claim 1, wherein the semiconductor substrate includes silicon, and the dielectric liner includes an oxide.

8. The structure of claim 1, wherein the TSV includes a pair of adjacent TSVs in the semiconductor substrate, each of the pair of adjacent TSVs including the dielectric liner, and wherein the pair of adjacent TSVs include a shared air gap extending between the pair of adjacent TSVs.

9. A structure, comprising:
   a through semiconductor via (TSV) in a semiconductor substrate;
   a dielectric liner surrounding the TSV and between the TSV and the semiconductor substrate; and
   a plurality of elongated air gaps in the semiconductor substrate adjacent to the dielectric liner, each air gap having a first sidewall contacting the dielectric liner and a second sidewall distanced from the dielectric liner and immediately contacting the semiconductor substrate.

10. The structure of claim 9, wherein the plurality of elongated air gaps in the semiconductor substrate radiate outwardly from the dielectric liner and are discontinuous.

11. The structure of claim 9, wherein each of the plurality of elongated air gaps have a rectangular shape.

12. The structure of claim 11, wherein each of the plurality of elongated air gaps contact an outermost sidewall of the dielectric liner and are entirely outside the dielectric liner.

13. The structure of claim 9, wherein each of the plurality of elongated air gaps have a height that is up to approximately 90% of a height of the TSV.

14. The structure of claim 9, wherein the TSV includes a pair of adjacent TSVs in the semiconductor substrate, each of the pair of adjacent TSVs including the dielectric liner, and wherein the pair of adjacent TSVs include a shared air gap extending between the pair of adjacent TSVs.

15. A method comprising:
    forming a through semiconductor via (TSV) in a frontside of a semiconductor substrate and a dielectric liner surrounding the TSV and between the TSV and the semiconductor substrate;
    forming a plurality of elongated air gaps in the semiconductor substrate adjacent to the dielectric liner, each air gap having a first sidewall contacting the dielectric liner and a second sidewall distanced from the dielectric liner and immediately contacting the semiconductor substrate; and
    planarizing a backside of the semiconductor substrate to complete the TSV.

16. The method of claim 15, wherein the plurality of elongated air gaps in the semiconductor substrate radiate outwardly from the dielectric liner.

17. The method of claim 15, wherein each of the plurality of elongated air gaps have a rectangular shape.

18. The method of claim 17, wherein each of the plurality of elongated air gaps contact an outermost sidewall of the dielectric liner and are entirely outside the dielectric liner.

19. The method of claim 15, wherein each of the plurality of elongated air gaps have a height that is approximately 90% of a height of the TSV.

20. The method of claim 15, wherein the TSV includes a pair of adjacent TSVs in the semiconductor substrate, each of the pair of adjacent TSVs including the dielectric liner, and wherein forming the plurality of air gaps includes forming a shared air gap extending between the pair of adjacent TSVs.

* * * * *